(12) United States Patent
Park (10) Patent No.: US 8,667,805 B2
(45) Date of Patent: Mar. 11, 2014

(54) AIR CONDITIONING SYSTEM FOR COMMUNICATION EQUIPMENT AND CONTROLLING METHOD THEREOF

(75) Inventor: Hee Tae Park, Yongin-si (KR)

(73) Assignee: Chang Jo 21 Co., Ltd., Gyeonggi-Do (KR)

( * ) Notice: Subject to any disclaimer, the term of this patent is extended or adjusted under 35 U.S.C. 154(b) by 762 days.

(21) Appl. No.: 12/310,592

(22) PCT Filed: Sep. 15, 2006

(86) PCT No.: PCT/KR2006/003692
§ 371 (c)(1),
(2), (4) Date: Feb. 27, 2009

(87) PCT Pub. No.: WO2008/026792
PCT Pub. Date: Mar. 6, 2008

(65) Prior Publication Data
US 2010/0236263 A1     Sep. 23, 2010

(30) Foreign Application Priority Data
Sep. 1, 2006 (KR) .................. 10-2006-0084182

(51) Int. Cl.
*F25B 7/00* (2006.01)
*F25B 49/00* (2006.01)
*F25D 17/00* (2006.01)

(52) U.S. Cl.
USPC ............... 62/175; 62/183; 62/185; 62/228.1; 62/229; 62/513

(58) Field of Classification Search
USPC ........ 62/113, 175, 181, 183, 185, 201, 228.1, 62/229, 513, 228.5, 510
See application file for complete search history.

(56) References Cited

U.S. PATENT DOCUMENTS

| | | | | |
|---|---|---|---|---|
| 6,666,042 | B1 * | 12/2003 | Cline et al. ...................... | 62/175 |
| 7,984,621 | B2 * | 7/2011 | Park ................................ | 62/333 |
| 2009/0056370 | A1 * | 3/2009 | Park ................................ | 62/513 |
| 2010/0186442 | A1 * | 7/2010 | Park ................................ | 62/510 |

FOREIGN PATENT DOCUMENTS

| | | |
|---|---|---|
| JP | 09-250779 | 9/1997 |
| JP | 2001-41503 | 2/2001 |
| JP | 2004-293894 | 10/2004 |

* cited by examiner

*Primary Examiner* — Marc Norman
(74) *Attorney, Agent, or Firm* — The PL Law Group, PLLC (57) ABSTRACT

An air conditioner for communication equipment is provided. The air conditioner includes an indoor module disposed at an indoor space of a base station having communication equipment and including an indoor heat exchanger and an indoor ventilator, an outdoor module disposed at an outside of the base station and including an outdoor ventilator, a brine cooling cycle including first and second outdoor brine heat exchangers, and first and second brine coolers, the indoor heat exchanger, and a brine pump, which are connected through a brine pipe, a first refrigerant cooling cycle including an expansion valve, the first brine cooler, a compressor, and a first outdoor refrigerant heat exchanger, which are connected through a first refrigerant pipe, and a second refrigerant cooling cycle including an expansion valve, the second brine cooler, a compressor, and a second outdoor refrigerant heat exchanger, which are connected through a second refrigerant pipe.

7 Claims, 5 Drawing Sheets

AIR CONDITIONING SYSTEM FOR COMMUNICATION EQUIPMENT AND CONTROLLING METHOD THEREOF

TECHNICAL FIELD

The present invention relates to an air conditioner for communication equipment, and more particularly, to an air conditioner for communication equipment, which has a comparative small size and steadily protects the communication equipment from noise, overheating, and malfunctioning, and a control method thereof.

BACKGROUND ART

In general, an air conditioner uses the heat of evaporation, which extracts heat from a peripheral area when refrigerant is evaporated. The air conditioner commonly uses ammonia, Freon gas, azeotropic refrigerant mixture, and chloromethyle, which are easily evaporated even at a normal temperature, as refrigerant.

The air conditioner generally includes a compressor, a condenser, an expansion valve, a capillary tube, and an evaporator. The compressor compresses a gaseous refrigerant at a high pressure and outputs the compressed gaseous refrigerant to the condenser. The condenser condenses the compressed gaseous refrigerant to a liquid refrigerant through exchanging heat with external air. The liquid refrigerant is transformed to low pressure atomized refrigerant through the expansion valve and the capillary tube.

Then, the low pressure atomized refrigerant flows in the evaporator. The evaporator evaporates the refrigerant to exchange heat with internal air. The evaporated refrigerant flows in the compressor again. As described above, the refrigerant circulates through the compressor, the condenser, the expansion value, and the evaporator. The evaporation heat of refrigerant, which is generated from the evaporator, cools the air down, and a ventilation fan ventilates the cool air to a predetermined space or to a target object to cool down.

As described above, the conventional air conditioner cools down a predetermined space or a target object using refrigerant that can be easily transformed in phase, for example, liquefaction and evaporation.

In general, a plurality of wired/wireless communication equipment is disposed in a communication base station and a communication vehicle. The communication equipment constantly generates the certain amount of heat. Such heat may cause the communication equipment to malfunction. Therefore, it is required to cool down the communication equipment 24-hours a day and 7-days a week in order to stably operate the communication equipment.

In order to cool down the communication equipment, an air conditioner is used. However, the conventional air conditioner operates only by electric power from an external power source without properly using outdoor cool air which naturally sustains a cool temperature according to an outdoor temperature. Therefore, the conventional air conditioner has a disadvantage of large power consumption.

DISCLOSURE OF INVENTION

Technical Problem

An embodiment of the present invention is directed to providing an air conditioner for communication equipment and a control method thereof in order to reduce the size and the noise thereof, minimize power consumption by properly using an nature chill air according to outdoor temperature, stably sustain the cooling state of the communication equipment, and improve the heat radiating efficiency of a hot section (radiator) in a cooling cycle through a dual heat exchange structure.

Other objects and advantages of the present invention can be understood by the following description, and become apparent with reference to the embodiments of the present invention. Also, it is obvious to those skilled in the art of the present invention that the objects and advantages of the present invention can be realized by the means as claimed and combinations thereof.

Technical Solution

In accordance with an aspect of the present invention, there is provided an air conditioner for communication equipment, including: an indoor module disposed at an indoor space of a base station having communication equipment and including an indoor heat exchanger and an indoor ventilator; an outdoor module disposed at an outside of the base station and including an outdoor ventilator; a brine cooling cycle including first and second outdoor brine heat exchangers, and first and second brine coolers, the indoor heat exchanger, and a brine pump, which are connected through a brine pipe; a first refrigerant cooling cycle including an expansion valve, the first brine cooler, a compressor, and a first outdoor refrigerant heat exchanger, which are connected through a first refrigerant pipe; and a second refrigerant cooling cycle including an expansion valve, the second brine cooler, a compressor, and a second outdoor refrigerant heat exchanger, which are connected through a second refrigerant pipe, wherein the first outdoor brine heat exchanger is closely disposed at the first outdoor refrigerant heat exchanger, the second outdoor brine heat exchanger is closely disposed at the second outdoor refrigerant heat exchanger, and the outdoor ventilator is interposed between the first outdoor refrigerant heat exchanger and the second outdoor refrigerant heat exchanger.

In accordance with another aspect of the present invention, there is provided a method for controlling an air conditioner for communication equipment including the steps of: a) measuring an indoor temperature of a base station, an outdoor temperature of the base station, and a brine temperature using an indoor temperature sensor, an outdoor temperature sensor, and a brine temperature sensor; b) comparing the measured indoor temperature with a first threshold, and interrupting the air conditioner if the measured indoor temperature is lower than the first threshold; c) operating a first outdoor refrigerant heat exchanger and a compressor if the measured indoor temperature is higher than a second threshold, and interrupting the first outdoor refrigerant heat exchanger and the compressor if the measured indoor temperature is lower than the second threshold; and d) operating first and second outdoor refrigerant heat exchangers and compressors if the measured indoor temperature is higher than a third threshold, and interrupting the second outdoor refrigerant heat exchanger and a compressor if the measured indoor temperature is lower than the third threshold.

An air conditioner for communication equipment according to an embodiment of the present is physically divided into an indoor module and an outdoor module. Expansion valves, an evaporator, a compressor, and a condenser are distributed in the indoor module, and the outdoor module. Herein, the evaporator may be referred as a heat exchanger, a heat absorber, and a cold section. The condenser may be referred as a heat exchanger, a heat radiator, and a hot section. A cooling cycle includes a brine cooling cycle and first and second refrigerant cooling cycles. The brine cooling cycle directly cools communication equipment down. The radiator of the brine cooling cycle includes first and second outdoor brine heat exchangers using outdoor air and brine coolers of the first and second refrigerant cooling cycles, thereby selectively cooling brine down.

In a radiator, an outdoor ventilator improves heat radiating efficiency by circulating outdoor air sequentially through the first outdoor brine heat exchanger and the first outdoor refrigerant heat exchanger to the outside, or circulating outdoor air sequentially through the second outdoor brine heat exchanger and the second outdoor refrigerant heat exchanger to the outside.

Advantageous Effects

An air conditioner for communication equipment and a control method thereof according to an embodiment of the present invention can reduce the size and the noise thereof, minimize power consumption by properly using an nature chill air according to outdoor temperature, stably sustain the cooling state of the communication equipment, and improve the heat radiating efficiency of a hot section (radiator) in a cooling cycle through a dual heat exchange structure.

BEST MODE FOR CARRYING OUT THE INVENTION

The advantages, features and aspects of the invention will become apparent from the following description of the embodiments with reference to the accompanying drawings, which is set forth hereinafter.

Figure 1:
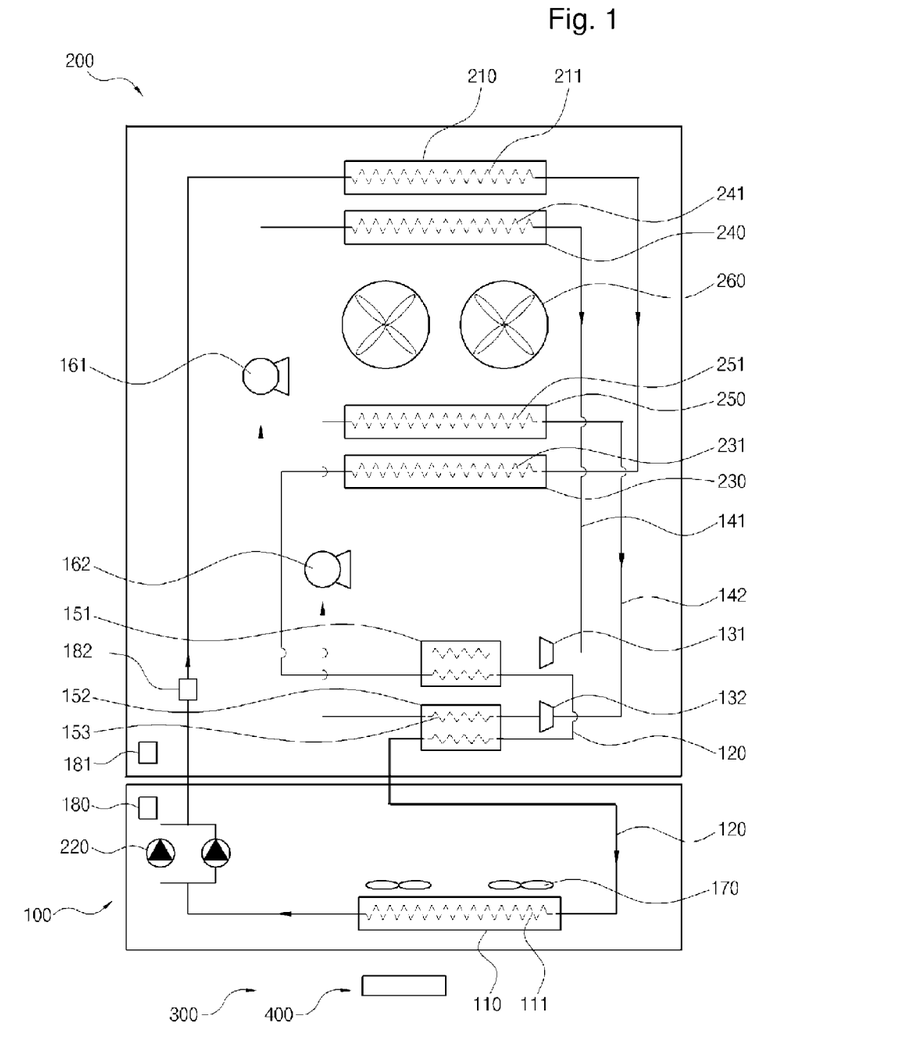
FIG. 1 is a diagram illustrating an air conditioner for communication equipment according to an embodiment of the present invention.
Figure 2:
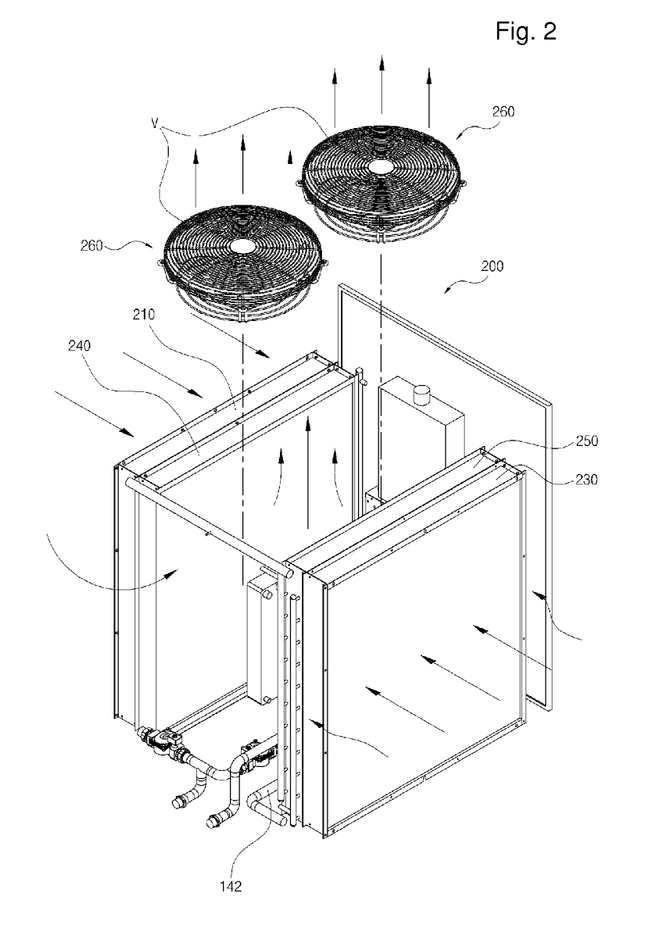
FIG. 2 is a perspective view illustrating a dual heat exchange structure of an outdoor module in an air conditioner for communication equipment according to an embodiment of the present invention.
Figure 3:
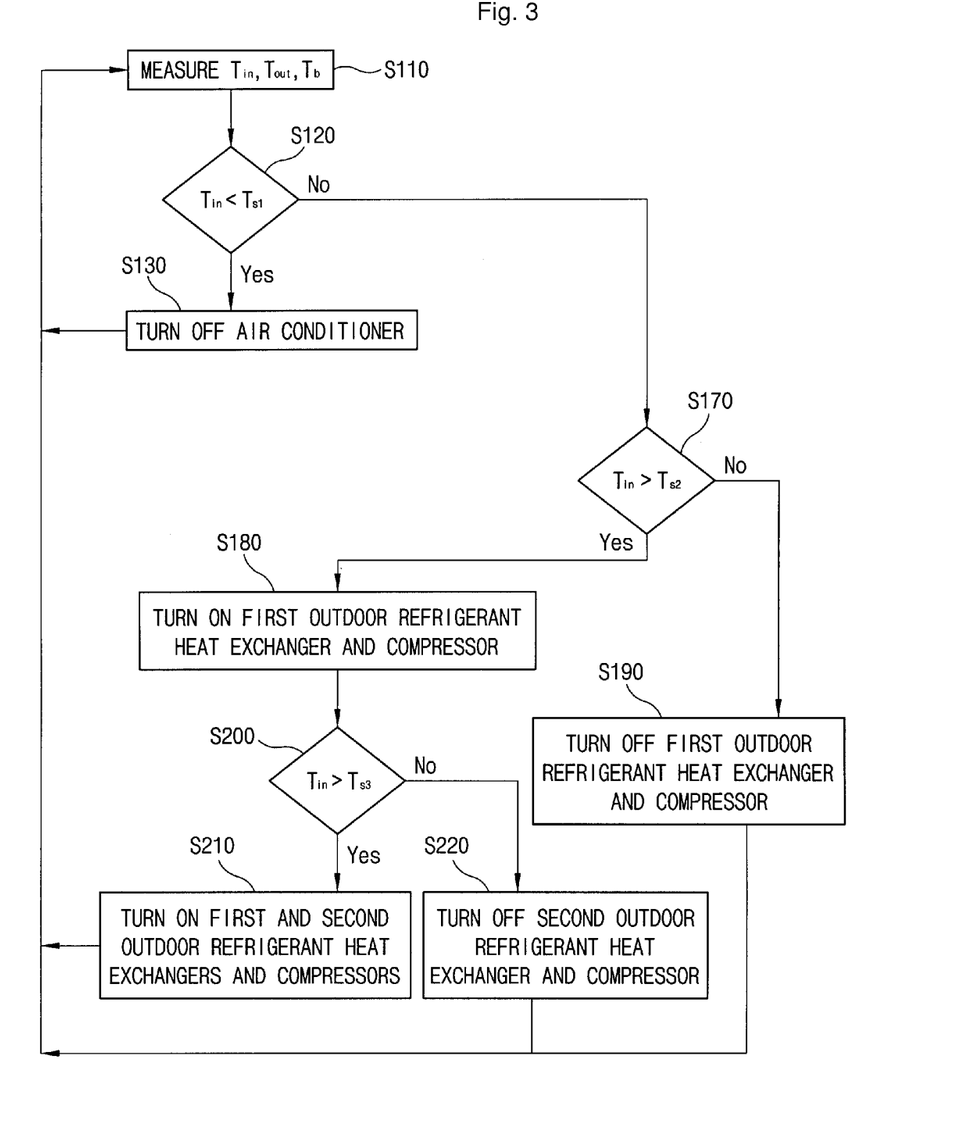
FIG. 3 is a flowchart illustrating a method for controlling an air conditioner for communication equipment according to an embodiment of the present invention.
Figure 4:
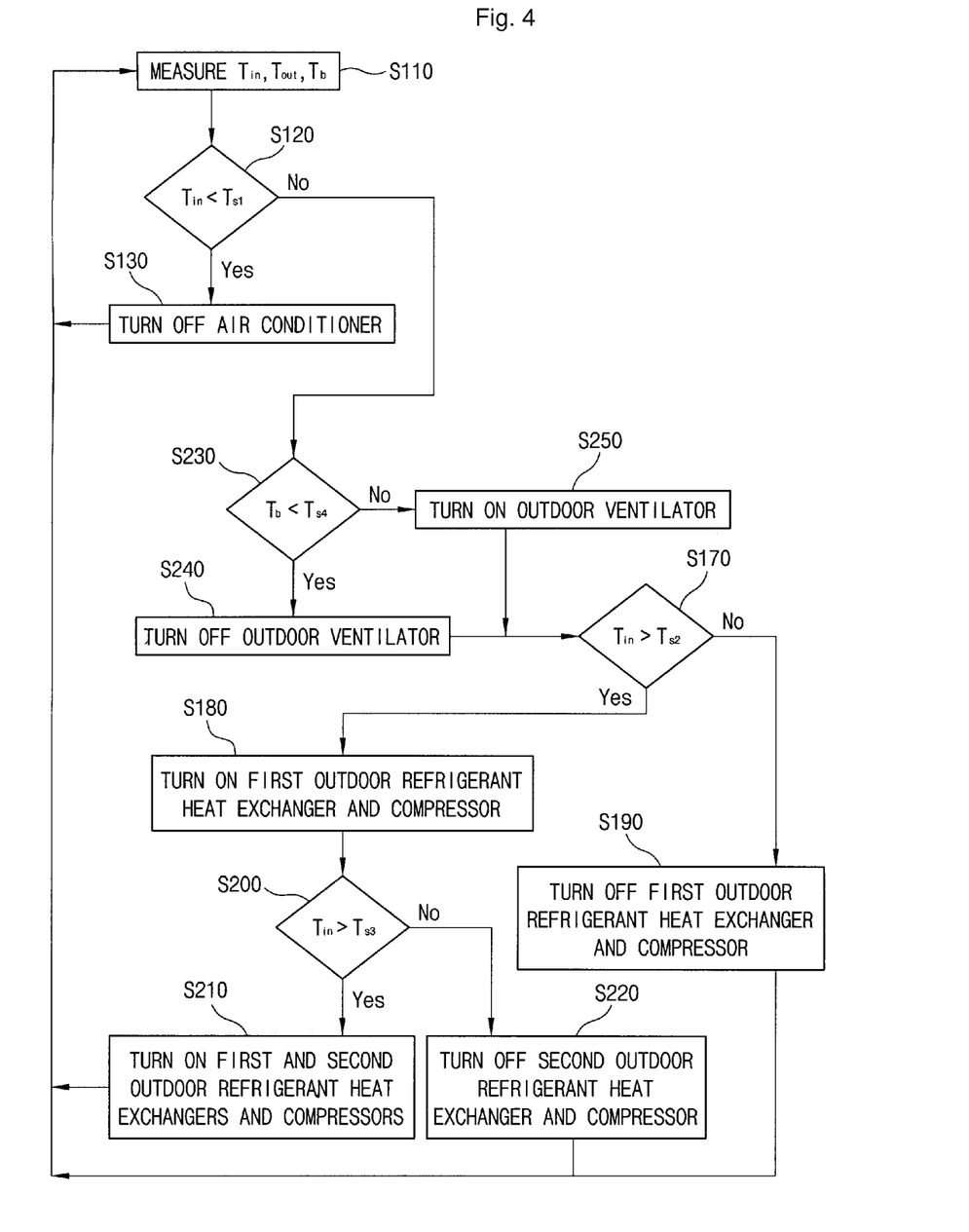
FIG. 4 is a flowchart illustrating a method for controlling an air conditioner for communication equipment according to another embodiment of the present invention.
Figure 5:
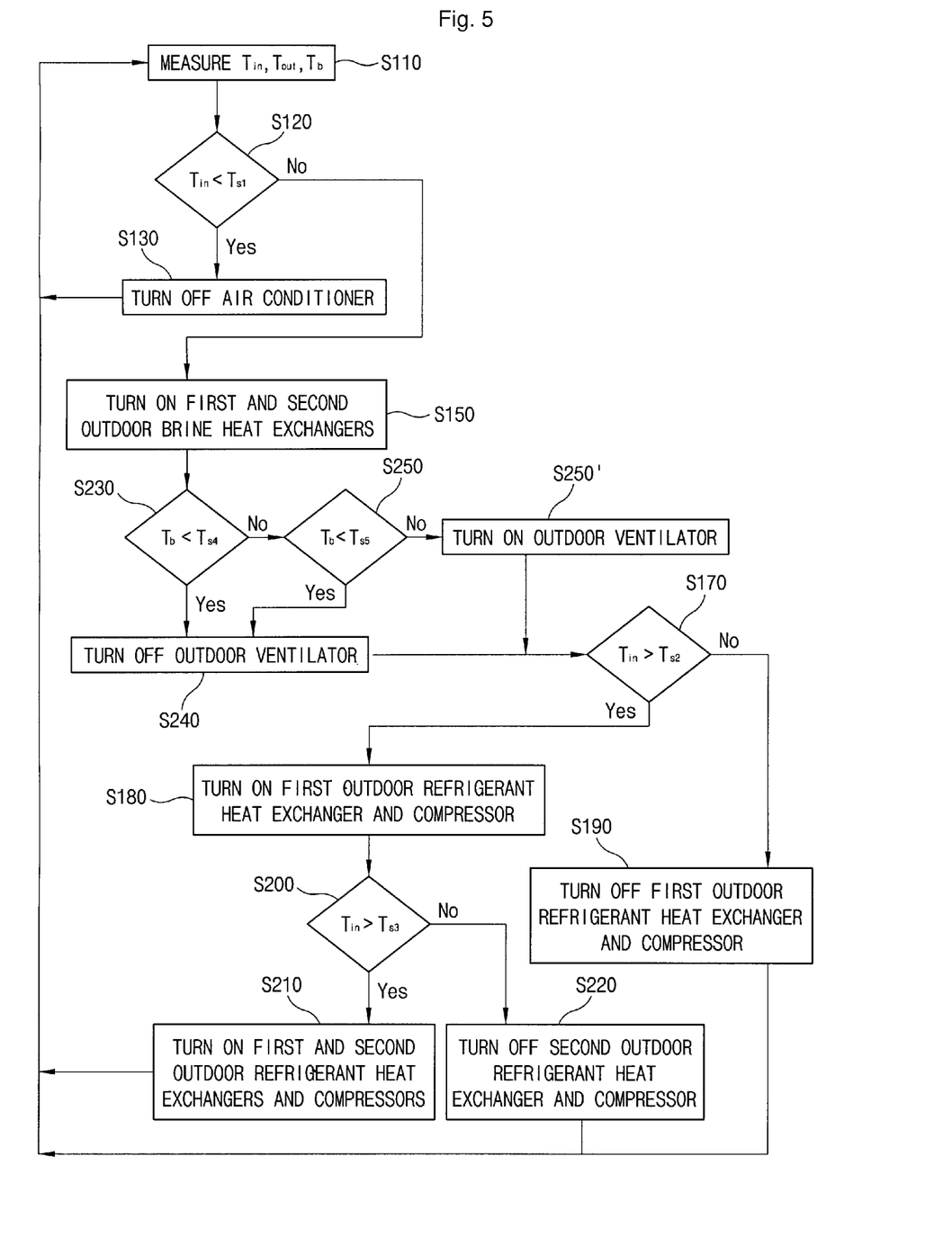
FIG. 5 is a flowchart illustrating a method for controlling an air conditioner for communication equipment according to still another embodiment of the present invention.

FIG. 1 is a diagram illustrating an air conditioner for communication equipment according to an embodiment of the present invention, and FIG. 2 is a perspective view illustrating a dual heat exchange structure of an outdoor module in an air conditioner for communication equipment according to an embodiment of the present invention. FIGS. 3 to 5 are flowcharts illustrating a method for controlling an air conditioner for communication equipment according to embodiments of the present invention.

As shown in FIGS. 1 and 2, the air conditioner according to the present embodiment includes a brine cooling cycle and first and second refrigerant cooling cycles.

The brine cooling cycle is formed by connecting first and second outdoor brine heat exchangers 210 and 230, brine coolers 151 and 152, an indoor heat exchanger 110, and a brine pump 220 through a brine pipe 120. The first and second outdoor brine heat exchangers 210 and 230 and the brine coolers 151 and 152 are equivalent to a radiator and an expansion valve in a cooling cycle. The indoor heat exchanger 110 is equivalent to a heat absorbing unit, and the brine pump 220 is equivalent to a compressor in a cooling cycle.

The first refrigerant cooling cycle is formed by connecting an expansion valve 131, a first brine cooler 151, a compressor 161, and a first refrigerant heat exchanger 240 through a first refrigerant pipe 141.

The second refrigerant cooling cycle is formed by connecting an expansion valve 132, a second brine cooler 152, a compressor 162, and a second outdoor refrigerant heat exchanger 250 through a second refrigerant pipe 142.

The first and second brine coolers 151 and 152 are commonly used by the first and second refrigerant cooling cycles and the first and second brine cooling cycles. Although the first and second brine coolers 151 and 152 operate as a heat absorbing unit in the first and second refrigerant cooling cycles, the first and second brine coolers 151 and 152 operate as a radiator in the brine cooling cycle.

Physically, the air conditioner according to the present embodiment includes an indoor module 100 disposed at an indoor space of a base station 300 and an outdoor module 200 disposed at an outdoor space of the base station 300.

The indoor module 100 includes an indoor heat exchanger 110, an indoor ventilator 170, and a brine pump 220.

The indoor heat exchanger 110 is disposed on the brine pipe 120 and include a heat exchange tube 111 connected to the brine pipe 120.

The indoor ventilator 170 is disposed closely to a heat transfer surface where heat exchange occurs. Accordingly, the indoor ventilator 170 effectively circulates a cool air, which is cooled down by the indoor heat exchanger 110, in a direction to the communication equipment 400.

The brine pump 220 is disposed on the brine pipe 120 that extends from the indoor heat exchanger 110 of the indoor module 100. The brine pump 220 circulates the brine through the brine pipe 120. The brine pump 220 includes a pair of the brine pumps connected in parallel to stably cool down the communication equipment 400 in the base station 300 by driving one of the brine pumps if the other is out of order. However, the brine pump 200 may be embodied as one brine pump. Also, it is preferable that the brine pump 200 includes control values independently disposed at the inlet and the outlet thereof to properly control the flow quantity of brine.

The outdoor module 200 includes the first and second outdoor brain heat exchangers 210 and 230, and the first and second brine coolers 151 and 152, which are disposed on the brine pipe 120. The outdoor module 200 also includes the first expansion valve 131, the first brine cooler 151, the compressor 161, and the first outdoor refrigerant heat exchanger 240, which are disposed on a first refrigerant pipe 141. The outdoor module 200 further includes the expansion valve 132, the second brine cooler 152, the compressor 162, and the second outdoor refrigerant heat exchanger 250, which are disposed on a second refrigerant pipe 142.

Hereinafter, the parts of the brine cooling cycle in the outdoor module will be described at first. The first outdoor brine heat exchanger 210 is disposed in the outdoor module 200. The first outdoor brine heat exchanger 210 is connected to the brine pump 220 in the indoor module 100 through the brine pipe 120. The first outdoor brine heat exchanger 210 radiates heat through exchanging heat with the outside air. Basically, the temperature of the outside air must be lower than the temperature of the brine in order to radiate heat.

The second outdoor brine heat exchanger 230 is disposed in the outdoor module 200. The second outdoor brine heat exchanger 230 include an inlet side connected to the first outdoor brine heat exchanger 210 and the brine pipe 120 and an outlet side connected to the first brine cooler 151 in an outlet side, thereby radiating heat by contacting the outside air.

The first brine cooler 151 includes an inlet side connected to the second outdoor brine heat exchanger 230 and the brine pipe, and an outlet side connected to the second brine cooler 152. Since the refrigerant of the first refrigerant pipe flows in the first brine cooler 151 as a heat absorbing unit, the refrigerant of the first refrigerant pipe cools the brine of the brine pipe down.

The second brine cooler 152 includes an inlet side connected to the first brine cooler 151 and the brine pipe 120, and an outlet side connected to the indoor heat exchanger 110 of the indoor module 100. Since the refrigerant of the second refrigerant pipe flows through the second brine cooler 152 as the heat absorbing operation of the heat absorbing unit, the refrigerant of the second refrigerant pipe cools the brine down again. Such a structure makes the brine to doubly pass through the first and second brine coolers 151 and 152. Therefore, the cooling degree of the brine can be selectively controlled.

The brine is a solution or a liquid having a low freezing point, such as $CaCl_2$ and NaCl.

Hereinafter, the parts in the first refrigerant cooling cycle will be described. The expansion valve 131 is disposed on the first refrigerant pipe 141 and transforms high pressure liquid refrigerant supplied from the first refrigerant pipe 141 to low temperature and low pressure atomized refrigerant. In the present embodiment, general refrigerant such as Freon gas, ammonia, azeotropic refrigerant mixture, and chloromethyle is used as the refrigerant.

The first brine cooler 151 internally includes a heat exchanging tube 153. The first brine cooler 151 is connected to the first refrigerant pipe 141 extending from the first expansion valve 131. The first brine cooler 151 is an evaporator for evaporating low pressure atomized refrigerant and cooling down the brine using the evaporation heat of the refrigerant.

The compressor 161 is connected to the first refrigerant pipe 141 extending from the first brine cooler 151 to compress refrigerant that passes through the first brine cooler 151. The compressor 161 is a typical compressor for compressing the evaporated refrigerant at high pressure.

The first outdoor heat exchangers 240 internally include heat exchange tube 241. The first outdoor refrigerant heat exchanger 240 includes an inlet side connected to the compressor 161 and the first refrigerant pipe 141 and an outlet side connected to the expansion valve 131 and the first refrigerant pipe 141. The first outdoor refrigerant heat exchanger 240 is disposed closely to the first outdoor brine heat exchanger 210 on the brine pipe 120. The first outdoor brine heat exchanger 240 is disposed to make the first outdoor brine heat exchanger 210 to contact the outside air at first in an inflow direction of the outside air. The first outdoor refrigerant heat exchanger 240 is a condenser, a typical heat exchanger, for liquidizing the refrigerant by condensing the high pressure refrigerant applied from the compressor 161.

The second refrigerant cooling cycle includes parts similar to those of the first refrigerant cooling cycle. However, the second brine cooler 152 is disposed at the outlet side of the brine cooler 151 on the brine pipe 120. The second outdoor refrigerant heat exchanger 250 is disposed closely to the second outdoor brine heat exchanger 230 on the brine pipe 120. That is, the second outdoor refrigerant heat exchanger 250 is disposed to make the second outdoor brine heat exchanger 230 to contact the outside air at first in the inflow direction of the outside air. When the outdoor heat exchangers are installed at an outside air inflow side of an outdoor ventilator 260, the first and second outdoor brine heat exchangers are disposed at the outside and the first and second outdoor refrigerant heat exchangers are disposed at the inside as shown in FIG. 2. On the contrary, when the outdoor heat exchanges are disposed at an air ventilating side of the outdoor ventilator 260, the first and second outdoor brine heat exchangers are disposed at the inside, and the first and second outdoor refrigerant heat exchangers are disposed at the outside.

The outdoor ventilator 260 is disposed closely to a heat transfer surface where the first and second outdoor brine heat exchangers 210 and 230 and the first and second outdoor refrigerant heat exchangers 240 and 250 change heat. Therefore, the outdoor ventilator 260 maximizes the efficiency of neat-exchanging with the outside air through contacting the outside air in the outdoor heat exchangers 210, 230, 240, and 250.

As one embodiment of the present invention, the first and second outdoor refrigerant heat exchangers 240 and 250 are disposed at a predetermined distance to face each other in a direction to the inside of the outdoor module 200. The outdoor ventilator 260 is interposed between the first and second outdoor refrigerant heat exchangers 240 and 250. The first and second outdoor brine heat exchangers 210 and 230 are disposed at the outside of the first and second outdoor refrigerant heat exchangers 240 and 250 to face the first and second outdoor refrigerant heat exchangers 240 and 250. Herein, the outside denotes the outside direction of the outdoor module 200, that is, a direction to the outside air inflow side of the outdoor module 200. Such arrangement of the heat exchangers 210, 230, 240, and 250 improves space efficiency for reducing the size of the outdoor module 200. Also, since such arrangement requires less number of outdoor ventilators 260, the noise of the outdoor module 200 can be reduced.

The outdoor ventilator 260 is disposed at the middle between the first and second outdoor refrigerant heat exchangers 240 and 250, for example, the upper center of the outdoor module 200 as shown in FIG. 2. When the outdoor ventilator 260 operates, the outdoor ventilator sucks in the outside air from the outside air inlets, for example, disposed at the left and the right side of the heat exchangers 210 and 230 as shown in FIG. 2. Then, the outdoor ventilator 260 discharges the outside air to a ventilation pipe V. Therefore, the outside air sequentially passes through the first and second outdoor brine heat exchangers 210 and 230 and the first and second outdoor refrigerant heat exchangers 240 and 250. The outside air is ventilated to the outside again.

Such arrangement of the heat exchangers and the outdoor ventilator makes the outside air to pass through the first and second outdoor brine heat exchangers 210 and 230, which are comparatively low temperature, before the first and second outdoor refrigerant heat exchangers 240 and 250. That is, such arrangement prevents the heat exchange efficiency of the first and second outdoor brine heat exchangers 210 and 230 from decreasing if the outside air passes through the first and second outdoor refrigerant heat exchangers 240 and 250 which are comparative high temperature before passing through the first and second outdoor brine heat exchangers 210 and 230.

Hereinafter, a temperature sensor, a controller (not shown), and an operating unit (not shown) for controlling an air conditioner will be described.

In order to effectively control, an indoor temperature sensor 180 is disposed in the indoor of the base station 300, and an outdoor temperature sensor 181 is disposed at the outside of the base station. A brine temperature sensor 182 is disposed at the outdoor module 200. That is, the brine temperature sensor 182 is installed on the brine pipe at the inlet side of the first outdoor heat exchanger 210.

Preferably, the controller is a control device having a microprocessor or PLC. The operating unit includes an air conditioner power switch, power switches for compressors, brine pumps in a brine cooling cycle and first and second refrigerant cooling cycles, an indoor ventilator switch, an outdoor ventilator switch, and an electric louver for opening and closing a bypass valve or an indoor air inlet.

The controller (not shown) selectively control the indoor heat exchanger 110, the first and second outdoor brine heat exchangers 210 and 230, the first and second outdoor heat exchangers 240 and 250, the brain cooling cycle, the first and second refrigerant cooling cycles, and entire cooling cycles by comparing temperatures sensed by the indoor temperature sensor 180, the outdoor temperature sensor 181, and the brain temperature sensor 182, thereby cooling the inside of the base station 300 down.

FIG. 3 is a flowchart illustrating a method for controlling an air conditioner for communication equipment shown FIG. 1.

Referring to FIG. 3, the indoor temperature sensor 180, the outdoor temperature sensor 181 and the brine temperature sensor 182 measure an indoor temperature $T_{in}$ in the base station 300, an outdoor temperature $T_{out}$ of the base station 300, and a brine temperature $T_b$ of the air conditioner at step S110.

Then, the measured indoor temperature $T_{in}$ is compared with a first threshold Ts1 at step S120. If the measured indoor temperature is lower than the first threshold Ts1, the air conditioner is turned off by turning off entire louvers 270 and 270' at step S130.

At step S170, the measured indoor temperature $T_{in}$ is compared with a second threshold Ts2, for example, 26.5° C. If the measured indoor temperature Tin is higher than the second threshold Ts2, the first outdoor refrigerant heat exchanger 240 and the compressor 161 are turned on at step S180. That is, the first refrigerant cooling cycle operates at step S180. If the measured indoor temperature $T_{in}$ is lower than the second threshold Ts2, the first refrigerant heat exchanger 240 and the compressor 161 are turned off at step S190. That is, the first refrigerant cooling cycle is interrupted at step S190.

The measured indoor temperature $T_{in}$ is compared with a third threshold Ts3, for example 27.5° C. at step S200. If the measured indoor temperature $T_{in}$ is higher than the third threshold Ts3, the first and second refrigerant heat exchangers 240 and 250 and the compressors 161 and 162 are turned on at step S210. That is, the first and second refrigerant cooling cycles operate at step S210. If the measured indoor temperature $T_{in}$ is lower than the third threshold Ts3, the second outdoor refrigerant heat exchanger 250 and the compressor 162 are turned off at step S220. That is, the second refrigerant cooling cycle is interrupted at step S220.

When the second outdoor refrigerant heat exchanger 250 and the compressor 162 are interrupted, a heat exchanger tube 251 of the second outdoor refrigerant heat exchanger 250, which is connected thereto, is not used anymore.

If it is not sufficient to cool the communication equipment 400 down by only driving the first and second outdoor brine heat exchangers 210 and 230 at the steps S190 and S220, the first outdoor refrigerant heat exchanger 240 and the compressor 161 are additionally turned on. That is, the first refrigerant cooling cycle additionally operates. If it is not sufficient to cool the communication equipment 400 down by only driving the first and second outdoor brine heat exchangers 210 and 230, the first outdoor refrigerant heat exchanger 240 and the compressor 161, for example, the first refrigerant cooling cycle, additionally operate in order to continuously sustain overall heat exchanging efficiency at a predetermined level.

The outdoor heat exchanger 110 and the indoor ventilator 170 are turned on and off at the same time according to the on/off state of the entire air conditioner in order to ventilate cold air in a direction to the communication equipment 400.

For example, the first, second, and third thresholds Ts1, Ts2, and Ts3 for the indoor temperature of the base station 300 are set to 25° C., 26.5° C., and 27.5° C., respectively. The first, second, and third thresholds Ts1, Ts2, and Ts3 may be set to various temperatures according to various communication equipment in the indoor of the base station 300.

By repeatedly performing the step S110 according to the conditions of the indoor temperature $T_{in}$ at the steps S130, S190, S210, and S220, the air conditioner can be controlled in real time according to the indoor temperature of the base station 300, which varies according to the outside air (the first and second outdoor brine heat exchangers 210 and 230), the operation mode of the first refrigerant cooling cycle (the first outdoor refrigerant heat exchanger 240 and the compressor 161), and the operation mode of the second refrigerant cooling cycle (the second outdoor refrigerant heat exchanger 250 and the compressor 162).

FIG. 4 is a flowchart illustrating a method for controlling an air conditioner for communication equipment according to another embodiment of the present invention.

Referring to FIG. 4, a brain temperature $T_b$ is compared with a fourth threshold Ts4, for example, 2 to 7° C. at step S230. If the brain temperature $T_b$ is lower than the fourth threshold Ts4, the operation of the outdoor ventilator 260 is interrupted at step S240. If the brine temperature $T_b$ is higher than the fourth threshold Ts4, the outdoor ventilator 260 is turned on at step S250.

If the brine temperature $T_b$ is lower than the fourth threshold Ts3, the outdoor ventilator 240 is turned off at step S240, thereby preventing the brine pipe 120 from being frozen by a lower indoor temperature in a winter season.

Preferably, if the brain temperature $T_b$ is higher than the fourth threshold Ts4, referring to FIG. 5, the brine temperature $T_b$ is compared with a fifth threshold value Ts5 for example, 10 to 15° C. at step S250. If the brain temperature $T_b$ is lower than the fifth threshold Ts5, the operation of the outdoor ventilator 260 is interrupted at step S240. If the brain temperature $T_b$ is higher than the fifth threshold Ts5, the outdoor ventilator 260 is turned on at step S250'.

The steps S250 and S250' are performed to prevent the outdoor ventilator 260 from being frequently turned on and off, thereby preventing the outdoor ventilator 260 from being overloaded, vibrated and making noises.

As described above, the air conditioner according to the present embodiment maximally use the outside air to cool down the communication equipment in the base station. Also, the air conditioner according to the present embodiment additionally uses a double heat exchanging structure formed by indoor and outdoor heat exchangers 110, 210, 230, 240, and 250. Therefore, the air conditioner can rapidly response the fine temperature variation of the communication equipment 400 and stably cools the communication equipment 400 by dynamically controlling the heat exchangers according to the fine temperature variation of the communication equipment.

While the present invention has been described with respect to certain preferred embodiments, it will be apparent to those skilled in the art that various changes and modifications may be made without departing from the spirits and scope of the invention as defined in the following claims.

The invention claimed is:

1. An air conditioner for communication equipment, comprising:
   an indoor module disposed at an indoor space of a base station having communication equipment and including an indoor heat exchanger and an indoor ventilator;
   an outdoor module disposed at an outside of the base station and including an outdoor ventilator;
   a brine cooling cycle including first and second outdoor brine heat exchangers, and first and second brine coolers, the indoor heat exchanger, and a brine pump, which are connected through a brine pipe;
   a first refrigerant cooling cycle including an expansion valve, the first brine cooler, a compressor, and a first outdoor refrigerant heat exchanger, which are connected through a first refrigerant pipe; and
   a second refrigerant cooling cycle including an expansion valve, the second brine cooler, a compressor, and a second outdoor refrigerant heat exchanger, which are connected through a second refrigerant pipe,
   wherein the first outdoor brine heat exchanger is closely disposed at the first outdoor refrigerant heat exchanger, the second outdoor brine heat exchanger is closely disposed at the second outdoor refrigerant heat exchanger, and the outdoor ventilator is interposed between the first outdoor refrigerant heat exchanger and the second outdoor refrigerant heat exchanger.

2. The air conditioner of claim 1, wherein the first and second outdoor refrigerant heat exchangers face the first and second outdoor brine heat exchangers in a direction to an inside, the first and second outdoor refrigerant heat exchangers are separated from the first and second outdoor brine heat exchangers at a predetermined distance, each of the first and second outdoor refrigerant heat exchangers forms a pair with a corresponding one of the first and second outdoor brine heat exchangers, and the outdoor ventilator is disposed at a middle between a pair of the heat exchangers in order to flow an outside air sequentially through the first and second outdoor brine heat exchangers and the first and second outdoor refrigerant heat exchangers to an outside.

3. The air conditioner of claim 1, wherein an indoor temperature sensor is disposed in the base station, an outdoor temperature sensor is disposed in the outside of the base station, and a brine temperature sensor is disposed on the brine pipe at an inlet side of the first outdoor brine heat exchanger.

4. The air conditioner of claim 2, wherein an indoor temperature sensor is disposed in the base station, an outdoor temperature sensor is disposed in the outside of the base station, and a brine temperature sensor is disposed on the brine pipe at an inlet side of the first outdoor brine heat exchanger.

5. A method for controlling an air conditioner for communication equipment comprising the steps of:
   a) measuring an indoor temperature of a base station, an outdoor temperature of the base station, and a brine temperature using an indoor temperature sensor, an outdoor temperature sensor, and a brine temperature sensor;
   b) comparing the measured indoor temperature with a first threshold, and interrupting the air conditioner if the measured indoor temperature is lower than the first threshold;
   c) operating a first outdoor refrigerant heat exchanger and a compressor if the measured indoor temperature is higher than a second threshold, and interrupting the first outdoor refrigerant heat exchanger and the compressor if the measured indoor temperature is lower than the second threshold; and
   d) operating first and second outdoor refrigerant heat exchangers and compressors if the measured indoor temperature is higher than a third threshold, and interrupting the second outdoor refrigerant heat exchanger and a compressor if the measured indoor temperature is lower than the third threshold.

6. The method of claim 5, further comprising the step of:
   b-1) interrupting an outdoor ventilator if the measured brine temperature is lower than a fourth threshold and operating the outdoor ventilator if the measure brine temperature is higher than the fourth threshold after the step b).

7. The method of claim 6, further comprising the step of:
   b-2) interrupting the outdoor ventilator if the measured brine temperature is higher than the fourth threshold and lower than the fifth threshold, and operating the outdoor ventilator if the measure brine temperature is higher than the fifth threshold after the step b-1).

* * * * *